United States Patent
Bohr et al.

(10) Patent No.: US 7,494,858 B2
(45) Date of Patent: Feb. 24, 2009

(54) TRANSISTOR WITH IMPROVED TIP PROFILE AND METHOD OF MANUFACTURE THEREOF

(75) Inventors: Mark T. Bohr, Aloha, OR (US); Steven J. Keating, Beaverton, OR (US); Thomas A. Letson, Beaverton, OR (US); Anand S. Murthy, Portland, OR (US); Donald W. O'Neill, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 237 days.

(21) Appl. No.: 11/173,660

(22) Filed: Jun. 30, 2005

(65) Prior Publication Data

US 2007/0004123 A1 Jan. 4, 2007

(51) Int. Cl.
H01L 21/336 (2006.01)
(52) U.S. Cl. .......... 438/198; 257/19; 257/368; 257/E21.223; 257/E21.232; 438/187; 438/733
(58) Field of Classification Search .......... 438/705, 438/712, 198, 733; 257/19, E21.223
See application file for complete search history.

(56) References Cited

U.S. PATENT DOCUMENTS

2005/0009250 A1  1/2005  Wonju et al.
2005/0285203 A1* 12/2005 Fukutome et al. ........... 257/368
2006/0138398 A1*  6/2006 Shimamune et al. ........... 257/19

FOREIGN PATENT DOCUMENTS

GB          1 538 650 A    1/1979
WO    WO 2005/0141288 A    5/2005
WO    PCT/US2006/025958   6/2006

OTHER PUBLICATIONS

Osamu Tabata, "pH-Controlled TMAH Etchants for Silicon Micromachining," Transducers '95, EUROSENSORS IX pp. 83-86, Jun. 25-29, 1995.*
Tellier, C.R. et al., "Characterization of the Anisotropic Chemical Attack of (HHL) Silicon Plates in a TMAH 25 Weight % Solution: Micromachining and Adequacy of the Dissolution Slowness Surface", Sensors and Actuators A, Elsevier Sequoia S.A., Lausanne, CH, vol. 105, No. 1, Jun. 15, 2003, pp. 62-75, XP004427479.

* cited by examiner

Primary Examiner—Dao H. Nguyen
(74) Attorney, Agent, or Firm—Blakely, Sokoloff, Taylor & Zafman LLP

(57) ABSTRACT

Embodiments are an improved transistor structure and the method of fabricating the structure. In particular, a wet etch of an embodiment forms source and drain regions with an improved tip shape to improve the performance of the transistor by improving control of short channel effects, increasing the saturation current, improving control of the metallurgical gate length, increasing carrier mobility, and decreasing contact resistance at the interface between the source and drain and the silicide.

15 Claims, 9 Drawing Sheets

US 7,494,858 B2

TRANSISTOR WITH IMPROVED TIP PROFILE AND METHOD OF MANUFACTURE THEREOF

FIELD

Embodiments of the invention relate to semiconductor transistors, and more specifically to increasing transistor performance by utilizing an improved tip profile and methods of manufacture thereof.

BACKGROUND

Silicon complementary metal oxide semiconductor ("CMOS") technology is a dominant microelectronic technology. CMOS offers high reliability, high levels of integration, low power dissipation, and is very cost-effective. For lower frequency applications CMOS will most likely remain the dominant technology. However, electron and hole mobility and other physical limitations in silicon may impede the extent to which CMOS devices can be utilized for higher speed applications that require high transistor switching rates Recent developments to improve the performance of CMOS transistors, in particular as the feature size (e.g., gate length) of the transistors decreases, include incorporating exotic dielectric materials, cobalt and nickel source and drain regions, copper and low dielectric constant materials for the interconnect levels, and high dielectric constant materials for transistor gates. Further, the shape, configuration, and material selection for the source and drain regions of the transistors has been a source of energetic research.

The addition of new materials for the regions of the transistor as introduced above has further been accompanied new processing techniques that either by themselves, or in combination with the new materials, increase the performance of a transistor manufactured therewith. The improved processing techniques may also permit transistor structures that have been otherwise unobtainable or commercially practicable for high volume manufacture.

DETAILED DESCRIPTION

Figure 1:
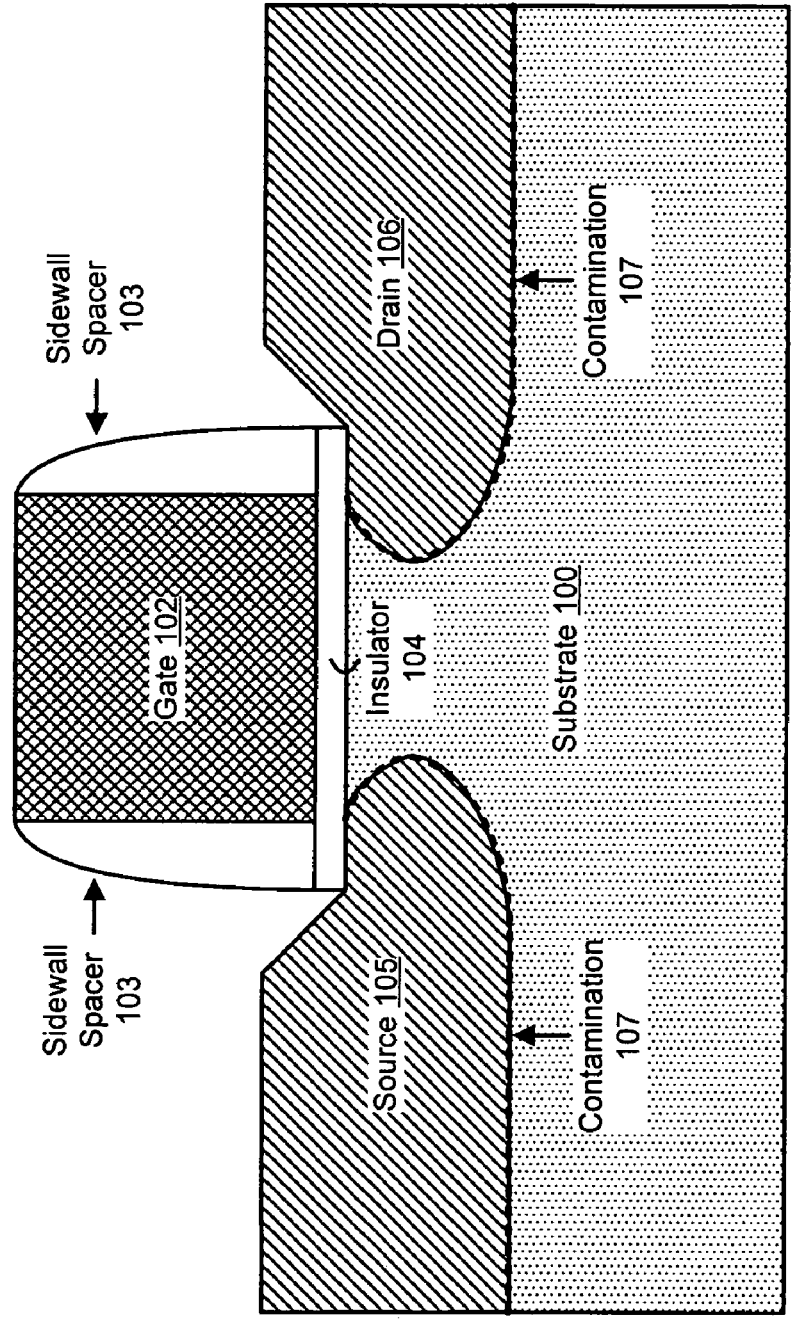
FIG. 1: illustration of a substrate cross section of a transistor including an epi-tip architecture with tip recesses formed by dry etch techniques.

Embodiments of a transistor with improved source and drain tip architectures and method of manufacture thereof will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, embodiments are an improved transistor structure and the method of fabricating the structure. In particular, a wet etch of an embodiment forms source and drain regions with an improved tip shape to improve the performance of the transistor by improving control of short channel effects, increasing the saturation current, improving control of the metallurgical gate length, increasing carrier mobility, and decreasing contact resistance at the interface between the source and drain and the silicide.

FIG. 1 illustrates a metal oxide semiconductor (MOS) transistor formed on substrate 100 including a gate 102, insulator 104, sidewall spacers 103, source 105, and drain 106 as is known in the art. The source 105 and drain 106 are formed in regions prepared with an undercut etch so that the source 105 and drain 106 extend laterally beneath the gate 102. Shallow implants and rapid thermal or flash anneal processing techniques are used to form the tips of the source 105 and drain 106. The etch to form the source 105 and drain 106 regions is a dry etch (e.g., an $SF_6$-based plasma etch). The dry etch of the embodiment forms the "bullet-shaped" source 105 and drain 106 tip regions as illustrated. Further, the dry etch generates significant concentrations of contamination 107 (e.g., F, $Cl_2$, C, and $O_2$) and surface non-uniformity that impairs the epitaxial deposition of the source 105 region and drain 106 region materials.

Figure 2:
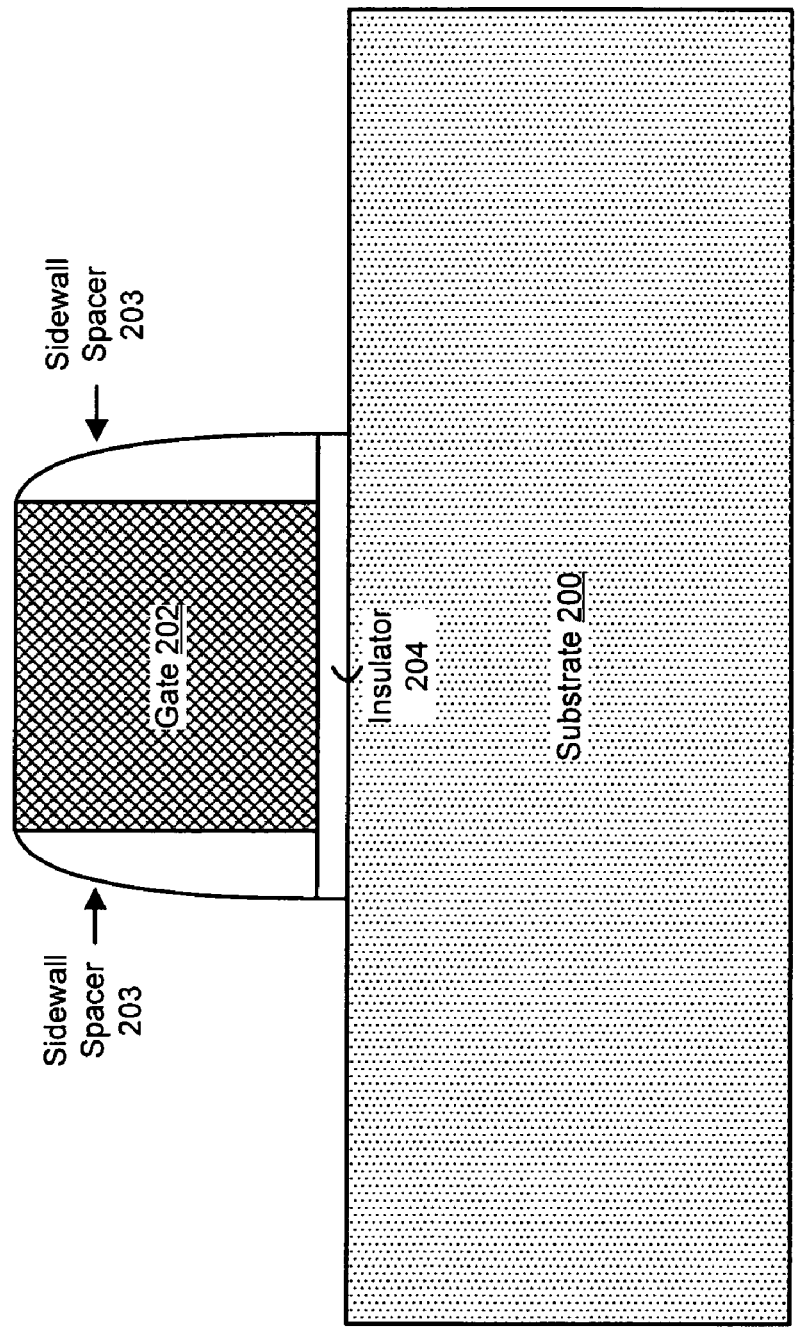
FIG. 2: illustration of a substrate cross section of an embodiment following the formation of an insulator, gate, and sidewall spacers

FIG. 2 illustrates a substrate 200 cross section following various processing steps to begin fabrication of a MOS transistor of an embodiment. One skilled in the art will recognize what foregoing processing steps have occurred, the explanation of which will be omitted. The substrate 200 of an embodiment is {001} silicon. A gate 202 has been formed and patterned atop an insulator 204, the composition of the gate 202 being, for example, polycrystalline silicon. The polycrystalline silicon gate 202 of an embodiment may be further pre-doped either with arsenic and/or phosphorous for NMOS devices and boron for PMOS devices. In an embodiment the insulator 204 is $SiO_2$. In other embodiments, the insulator 204 materials could be any high dielectric constant or "high-k" materials such as $HfO_2$, $ZrO_2$, and silicates of hafnium or zirconium. On each side of the gate 202 there is a sidewall spacer 203 in an embodiment formed of silicon oxide or silicon nitride. In other embodiments, spacer 203 materials could include silicon oxynitride or silicon carbide. Each sidewall spacer 203 serves as a hard mask for subsequent self-aligned processing steps. One skilled in the art will understand that, for example, the sidewall spacers 203 may be a hard mask for high dose implants in a lightly doped drain transistor design or other designs that would benefit from sidewall spacing as is well known in the art. The sidewall spacers 203 may further mask a wet or dry etch. The sidewall spacers 203 of an embodiment are approximately between 5 and 40 nanometers thick (i.e., lateral thickness from the edge of the gate 202) and in an embodiment approximately 15 nanometers thick.

Figure 3:
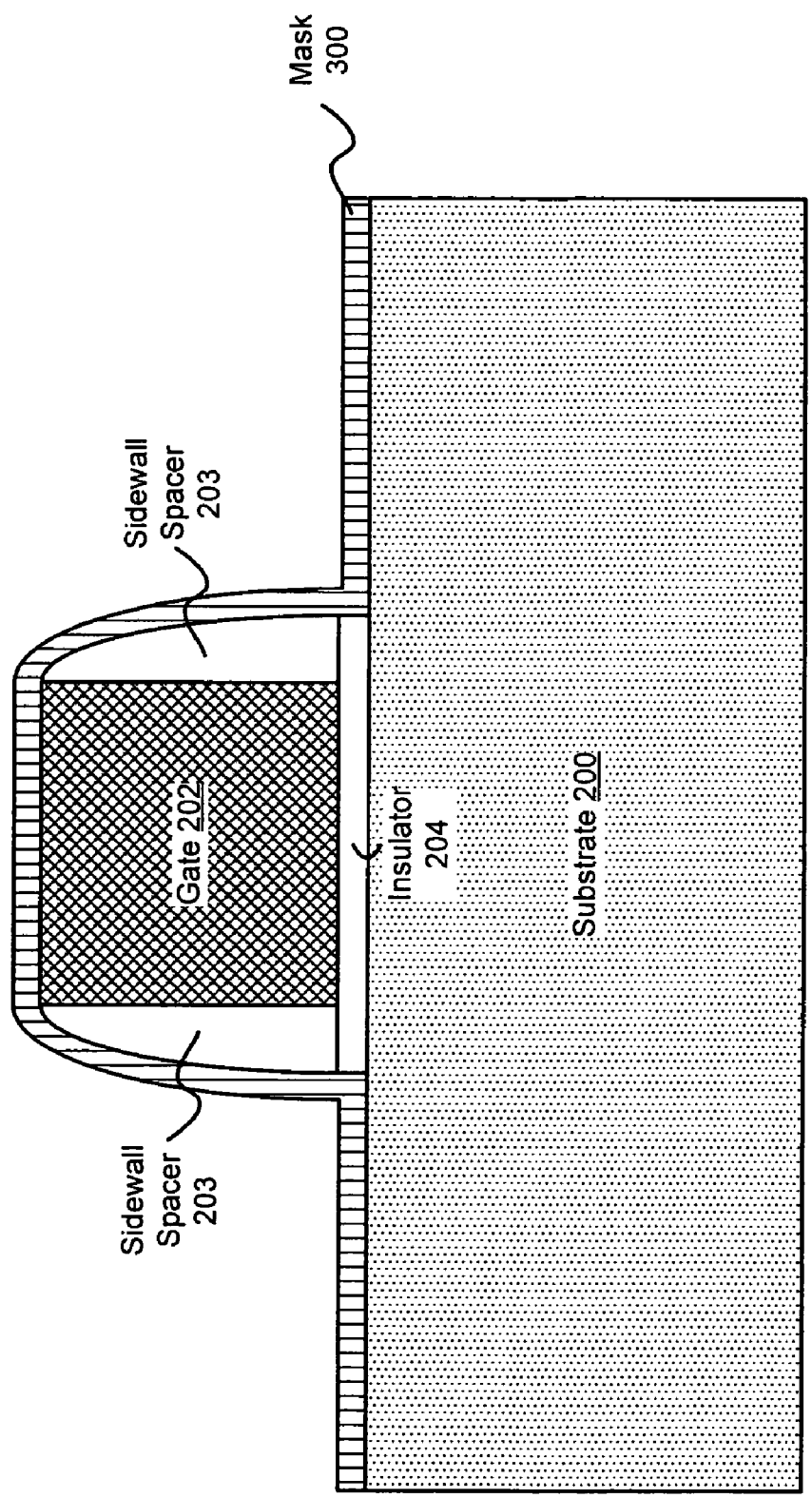
FIG. 3: illustration of the substrate cross section of FIG. 2 following the formation of a mask layer

FIG. 3 illustrates of the substrate 200 cross section of FIG. 2 following the formation of a mask 300. The mask 300 may be any type of material that can be blanket deposited and subsequently patterned to form a protective layer. In an embodiment, the mask 300 is silicon nitride or silicon carbide. In other embodiments, the mask 300 may be stacks of silicon oxide and nitride, or made of silicon oxynitride. The typical thickness of mask 300 is 30 nanometers and can range from 5-50 nanometers. Following patterning, the mask 300 will serve as a hard mask for subsequent processing steps, and in particular, the etch of an embodiment in substrate 200 to form the source and drain regions.

Figure 4:
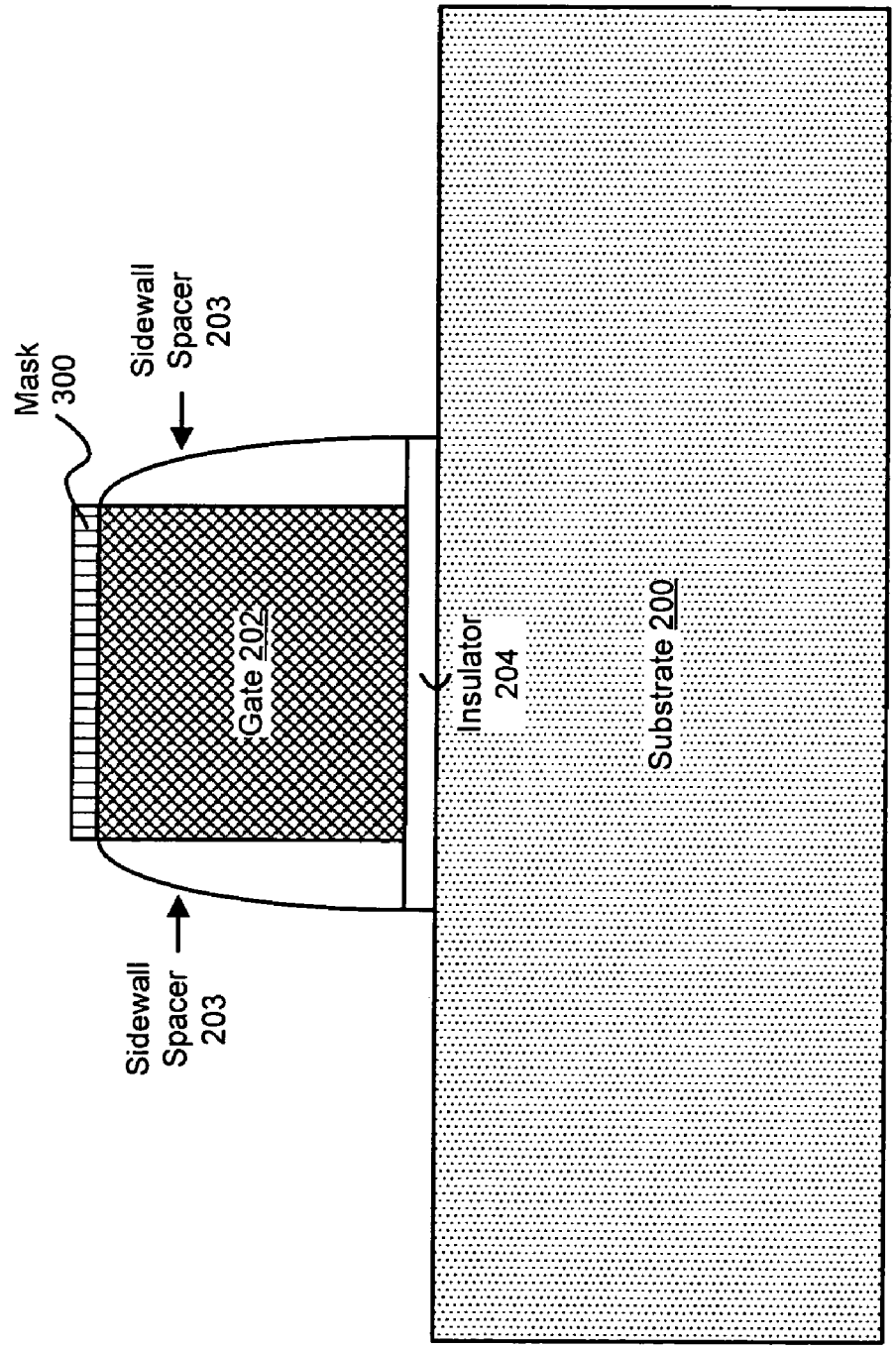
FIG. 4: illustration of the substrate cross section of FIG. 3 following the patterning of the mask to expose source and drain regions
Figure 6:
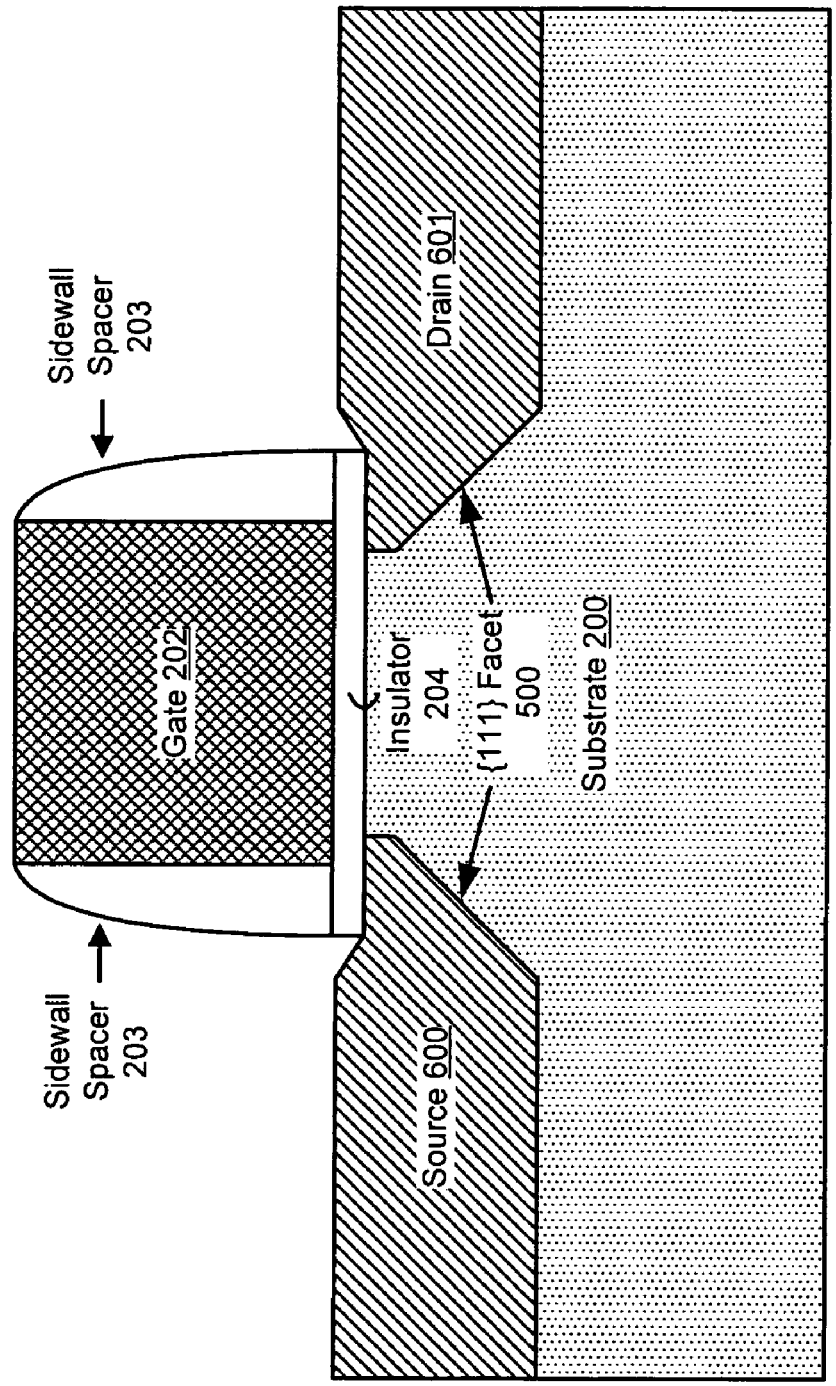
FIG. 6: illustration of the substrate cross section of FIG. 5 following the formation of a source and a drain

FIG. 4 illustrates the substrate 200 cross section of FIG. 3 following the patterning of the mask 300 to expose regions for source 600 and drain 601. The mask 300 can be photolithographically patterned by any method known in the art to pattern the materials comprising the mask 300 as introduced above. The mask 300 is patterned to expose the surface of the substrate 200 that will become source 600 and drain 601 (as illustrated by FIG. 6) and to protect the surface of the gate 202 from subsequent etch processes. The exposed surfaces of the sidewall spacers 203, based on their material composition (e.g., SiN or SiC) are substantially not effected by the etchant used to pattern the mask 300.

Figure 5:
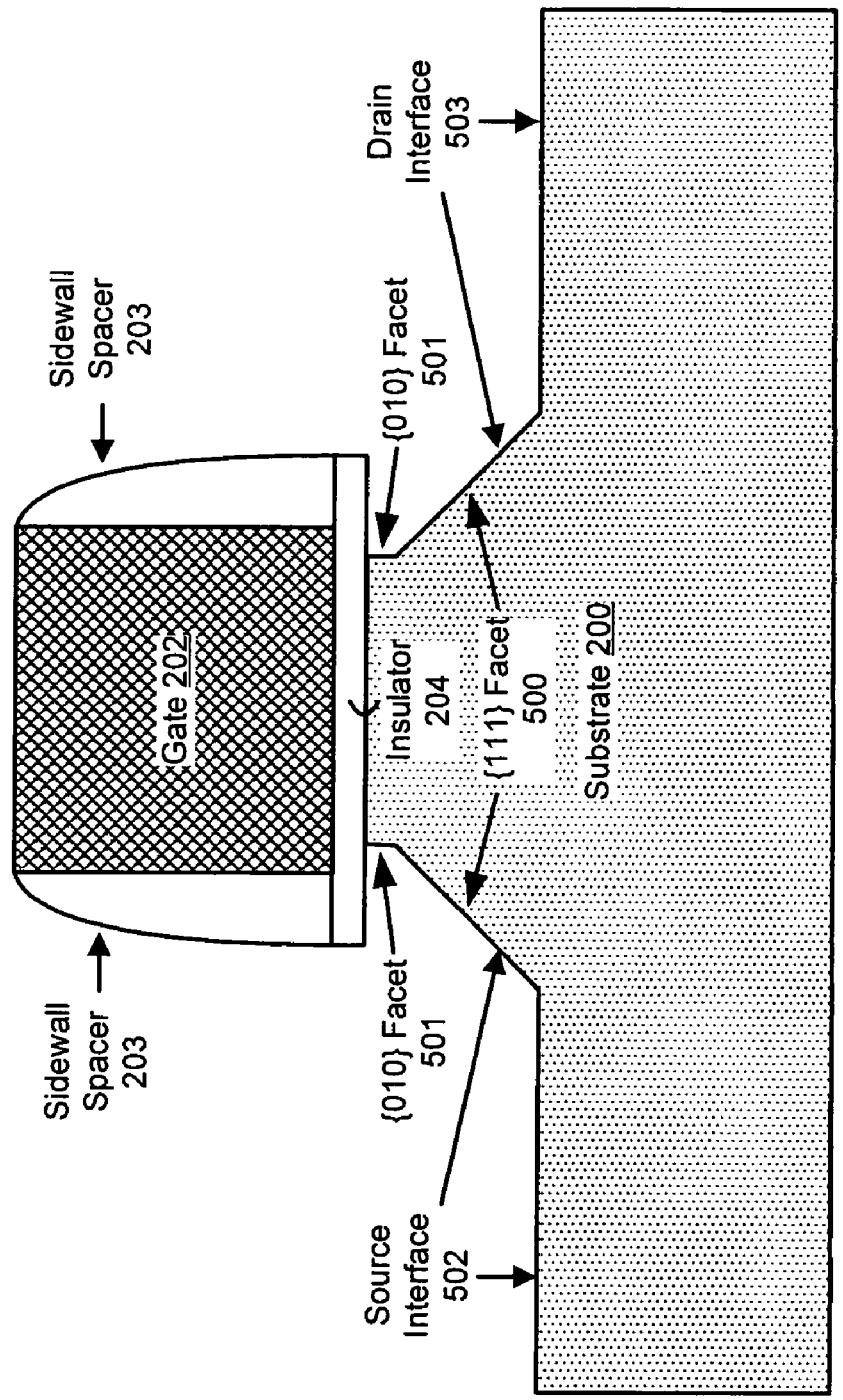
FIG. 5: illustration of the substrate cross section of FIG. 4 following the wet etch of an embodiment to form source and drain regions

FIG. 5 illustrates the substrate 200 cross section of FIG. 4 following the wet etch of an embodiment to form the source 600 and drain 601 regions. The wet etch of an embodiment utilizes $NH_4OH$ that is substantially selective to the {111} facet 500 of the silicon substrate 200. Said alternatively, the wet etch of an embodiment preferentially etches the substrate 200 based on crystallographic direction, and in particular etches the silicon substrate 200 much more slowly along the {111} plane to form the {111} facet 500 as the etch proceeds much more rapidly in other crystallographic directions. Additional wet etch chemistries include $NH_3OH$, TMAH, KOH, NaOH, BTMH, or an amine-based etchant, each of which in an embodiment has a pH approximately greater than 9.0. In an embodiment for which the wet etch is performed with an amine-based etchant, the amine-based etchant is diluted with deionized water. The diluted amine-based etchant solution of an embodiment is approximately 1.0 to 30.0 weight percent amine-based etchant in deionized water at a temperature of approximately between 24° C. and 90° C. In an embodiment, a 2.5 weight percent $NH_4OH$ solution with deionized water at approximately 24° C. etches source 600 and drain 601 regions to an approximately 170 nanometer undercut depth in an approximately 60 second dip. The angle between the {111} facet 500 of silicon substrate 200 and the silicon substrate 200 surface plane {100} is 54.7 degrees.

In an embodiment, the wet etch of an embodiment to form the source 600 and drain 601 regions is preceded by a hydrofluoric acid (HF) dip to remove any native oxide that may exist on the surfaces of the substrate 200 to be etched. In an embodiment, the native oxide is removed by a dilute hydrofluoric acid with an approximate 1:50 to 1:400 ratio with deionized water at approximately room temperature (e.g., approximately 24° C.). In an embodiment, the native oxide is removed by any buffered oxide etch chemistry targeted to remove approximately 20 angstroms to 30 angstroms of thermal silicon oxide.

The wet etch of an embodiment may further be followed by a rinse. In an embodiment, the rinse is a fast upflow deionized water rinse with a flow rate of approximately between 30 and 35 liters per minute. The rinse of an embodiment follows the wet etch of an embodiment quickly to control the wet etch. In an embodiment, the transfer time between the wet etch and the rinse is approximately between 5.0 and 8.0 seconds.

The gate 202 of the transistor should be defined by a material that is resistant to the wet etch chemistry of an embodiment. Further, the wet etch chemistry should be selective to the insulator 204 material so that it substantially does not etch the insulator 204. As noted above, the mask 300 protects the gate 202 during the wet etch of an embodiment. Accordingly, the mask 300 material and thickness should be robust enough to survive the wet etch of an embodiment and the dilute HF dip prior to the wet etch. As noted above, the HF dip is required to remove any native oxide from the area to be etched in the substrate 200 to form the source 600 and drain 601 regions, because the wet etch chemistry of an embodiment is selective to substantially not remove the insulator 204 material (e.g., silicon dioxide). Versus a dry etch to form the source 600 and drain 601 regions, both the HF dip and the wet etch of an embodiment may be performed by the same wet etch tool, reducing a source of process variance as, for example, the substrate 200 is transported (with associated delay) to a dry etch tool following the HF dip.

A highly {111} faceted tip profile achieved by the wet etch embodiment provides reduced volume in depletion and corresponding improved control of short channel effects compared to the conventional "bullet-shaped" tip profile formed by dry etch as illustrated by FIG. 1. The wet-etch of an embodiment also provides a highly passivated source interface 502 and drain interface 503 with substantially no interfacial contaminants prior to the epitaxial deposition of the source 600 and drain 601. The passivated and uncontaminated source interface 502 and drain interface 503 of the substrate 200 in turn enables very high quality epitaxial depositions of source 600 and drain 601 materials with substantially no defects as the deposited source 600 and drain 601 material substantially adopts the crystalline properties of the underlying passivated and uncontaminated source interface 502 and drain interface 503. The substantially defect-free source 600 and drain 601 have improved characteristics such as improved conductivity given improved carrier mobility and interface properties versus sources and drains epitaxially deposited on non-ideal surfaces. The improved interface also provides the ability to achieve higher concentrations of germanium during subsequent SiGe deposition without forming misfit dislocations or stacking faults. Alternatively, the superior interface provides the ability to deposit thicker epitaxial films for a given germanium concentration without inducing defects, such as misfit dislocations or stacking faults.

The wet etch of an embodiment to form the tip architecture for source 600 and drain 601 further obviates the problem of pitch dependent microloading commonly associated with the conventional dry-etch illustrated by FIG. 1. Microloading occurs when areas of a substrate for which the etch pattern is dense may etch at a different rate, or in a different way, versus areas where the pattern is more open. For a dry etch, this is partly the result of localized depletion of the etchant reactant species in regions where a lot of material must be removed. Further, it is difficult for etch reactants to navigate through narrow corridors of resist or a hard mask if the features are close together. However, at least the depletion of the reactant species (i.e., common to a reactive ion etch or RIE) cause of the microloading is substantially reduced by the wet etch of an embodiment, improving the uniformity of the etch over the surface of the substrate 200.

The wet etch and resulting transistor structure of an embodiment further improves process control of the metallurgical channel length based on incorporating fewer process variables compared to a plasma-based timed dry etch. For example, the high quality of the wet-etched surface with the substantial absence of any native oxide on the source interface 502 and drain interface 503 permits a longer work-in-process queue time prior to epitaxial deposition of the source 600 and drain 601 thereby addressing an important manufacturability concern for high-volume production. The profile shape is precise and is governed entirely by the crystallographic preference of the etch. The etch precision offered by the wet etch of an embodiment and correspondingly precise sources and drains also reduce the variability in linear $V_t$ and $I_{off}$ in the transistors fabricated according to an embodiment.

In addition to the benefits noted above, the tip architecture of the source 600 and drain 601 of an embodiment generates uniaxial strain in the channel region (i.e., the substrate 200 between the {010} facets 501 and directly beneath the insulator 204) from the epitaxial film in source 600 and drain 601 and source 600 and drain 601 tip regions. Adding tensile or compressive strain (depending on the particular application) to a semiconductor lattice increases the carrier mobility within the strained semiconductor.

The tip architecture of the source 600 and drain 601 of an embodiment further increases the back bias sensitivity of the transistor of an embodiment. The application of back bias to the transistor of an embodiment may improve the switching characteristics of the transistor. In particular, the application of back bias may increase the drive current, decrease the leak current, and decrease the power consumption of the transistor of an embodiment.

For a PMOS device the source 600 and drain 601 are epitaxially deposited silicon germanium, with the germanium concentration ranging from approximately 10 atomic % to 35 atomic %. The epitaxial deposition of SiGe could further include in situ boron doping with a boron concentration ranging from 5E19 $cm^{-3}$ to 3E20 $cm^{-3}$. In an embodiment, the source 600 and drain 601 SiGe epitaxial film includes approximately 22 atomic % germanium, approximately 9E19 $cm^{-3}$ boron concentration and has a thickness of approximately 120 nm. The epitaxial SiGe film imparts compressive stress into the channel region of the transistor, thereby increasing the channel mobility and transistor performance.

In an NMOS device, source 600 and drain 601 are epitaxially deposited silicon doped with carbon, and may further be in situ doped with phosphorus. The carbon concentration ranges from 0.5 atomic % to 3 atomic % and phosphorus concentration from 5E19 $cm^{-3}$ to 5E20 $cm^{-3}$. In an embodiment, the silicon film includes approximately 1.5 atomic % carbon, approximately 1E20 $cm^{-3}$ phosphorus, and has a thickness of approximately 100 nm. For the NMOS device, such a carbon doped silicon film imparts tensile strain to the channel region, thereby increasing the electron mobility (i.e., the dominant charge carrier in an NMOS device). The increased carrier mobility in turn allows for higher drive current and corresponding faster switching speeds.

A further benefit is that the {111} plane acts as an etch stop, allowing greater control of the wet etch versus dry etch approaches. As the wet etch of an embodiment is substantially preferential to the {111} plane of the silicon substrate 200, the etch will substantially progress along the {111} plane until such a preferred surface is unavailable. As such, the wet etch of an embodiment enables an overetch in the absence of an etch stop layer. Said differently, the profile of the etch adjacent to the gate 202 (i.e., the channel region of the transistor of an embodiment) is substantially unaffected by an etch that has exceeded a certain minimum etch duration. Such an overetch may continue to consume the substrate 200 along the {111} plane, but it will not substantially alter the functional areas of the substrate 200.

Further, the wet etch of an embodiment creates a {010} facet 501 in the channel region of the substrate 200 immediately adjacent to the insulator 204. After a small distance (i.e., order of nanometers) the wet etch of an embodiment then proceeds to form the {111} facet 500 as described above. The small distance of {010} facet 501 contributes to more precisely defining the metallurgical channel length of the transistor versus the dry-etch bullet shape illustrated in FIG. 1 and reduces the unpredictability of the short channel effects. More specifically, in an embodiment, an approximately 5 minute timed wet etch will provide a source 600 and drain 601 lateral recess beneath the gate 202 of approximately 20 nanometers. Further, the approximately 5 minute timed etch forms the vertical {010} facet extending down for up to approximately 3 nanometers.

FIG. 6 illustrates the substrate 200 cross section of FIG. 5 following the formation of a source 600 and a drain 601. The formation of the source 600 and drain 601 involves selective epitaxial deposition of highly doped films. For an NMOS transistor of an embodiment, source 600 and drain 601 are silicon doped with carbon and/or phosphorous. For a PMOS transistor of an embodiment, the source 600 and drain 601 are boron doped silicon germanium.

The wet etch of an embodiment, and the resulting {111} facet 501 that is both substantially passivated and contaminant-free permits the epitaxial deposition of high quality source 600 and drain 601 films as noted above. Further, the resulting surface of the source 600 and drain 601 is substantially flush with where the surface of the substrate 200 was prior to the wet etch of an embodiment versus the raised source 105 and drain 106 as illustrated by FIG. 1. The more flush surface of source 600 and drain 601 to the original surface of the substrate 200 reduces parasitic capacitances that hinder the performance of the resulting transistor.

Figure 7:
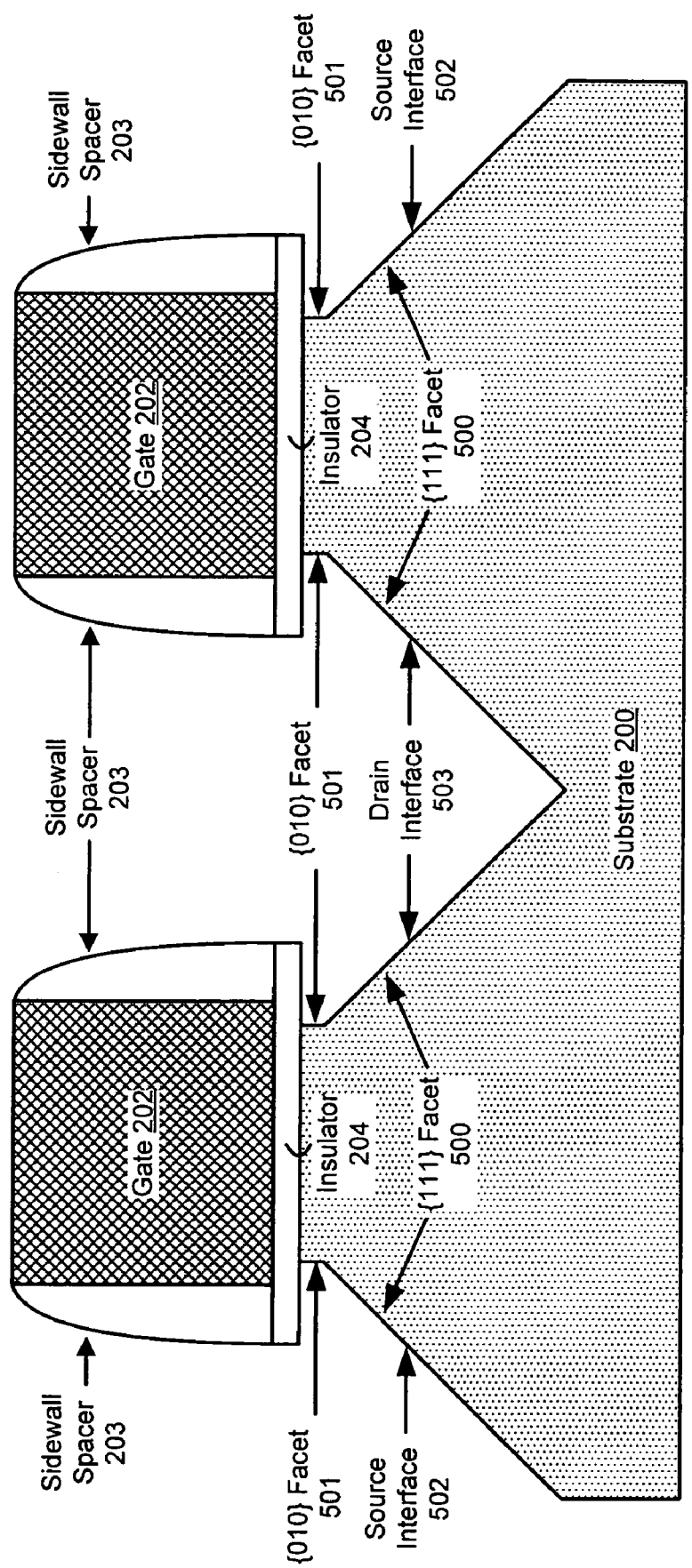
FIG. 7: illustration of a substrate cross section following the wet etch of an embodiment for two adjacent transistors

FIG. 7 illustrates the of a substrate 200 cross section following the wet etch of an embodiment illustrated by FIG. 5 for two adjacent gates. Of note is that the wet etch of an embodiment is substantially self-limiting. More specifically, as the wet etch of an embodiment progresses along the facets 500 for two adjacent transistors, the two {111} facets 500 meet essentially at the point of a triangle to form an etch with an overall "V" shape. Given the directionally selective nature of the wet etch of an embodiment, once the etched {111} facets 500 have met, the rate at which the wet etch proceeds further within the substrate 200 decreases.

Accordingly, the depth of the etch (i.e. from the surface of the substrate 200 to the deepest vertex of the joined {111} factes 500) can be controlled by the pitch, or distance between, adjacent transistors. For example, the vertex of the triangular etch formed opposite the surface of the substrate will be approximately 70.6 degrees and the other adjacent vertices will be approximately 54.7 degrees (the angle between the surface of the substrate 100 {001} plane and the {111} crystallographic plane within the silicon substrate). Knowing the transistor pitch or the depth of the self-limited over-etch allows calculation of the other parameter. Along those lines, the pitch uniformity substantially contributes to the uniformity of the depth of the wet etch of an embodiment and resulting structure of source 600 and drain 601.

Figure 8:
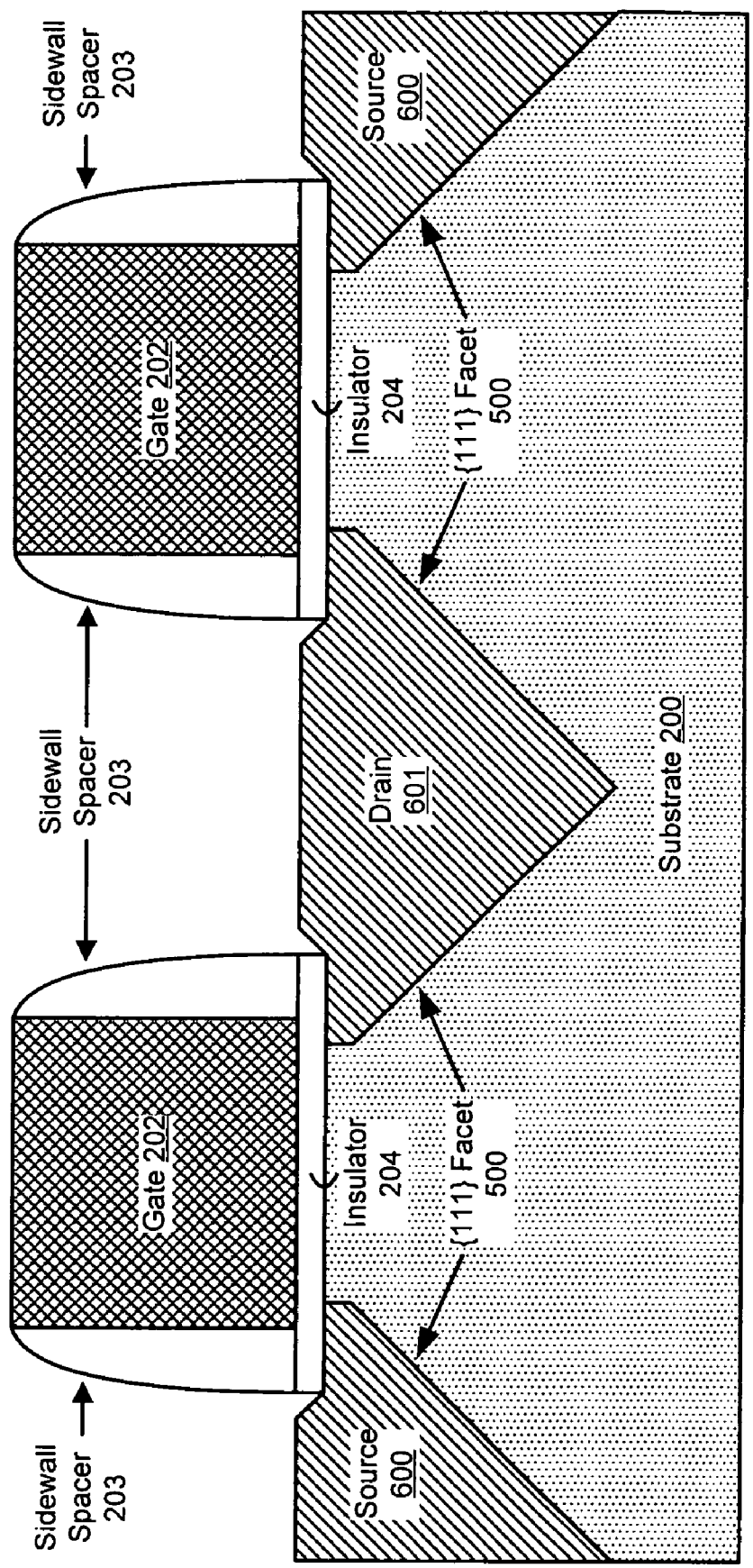
FIG. 8: illustration of the substrate cross section of FIG. 7 following the formation of sources and drains

FIG. 8 illustrates the substrate 200 cross section of FIG. 7 following the formation of sources 600 and drain 601. As noted with respect to FIG. 6, the resulting surface of the source 600 and drain 601 is substantially flush with where the surface of the substrate 200 was prior to the wet etch of an embodiment versus the raised source 105 and drain 106 as illustrated by FIG. 1. The more flush surface of source 600 and drain 601 to the original surface of the substrate 200 reduces parasitic capacitances that hinder the performance of the resulting transistor.

Figure 9:
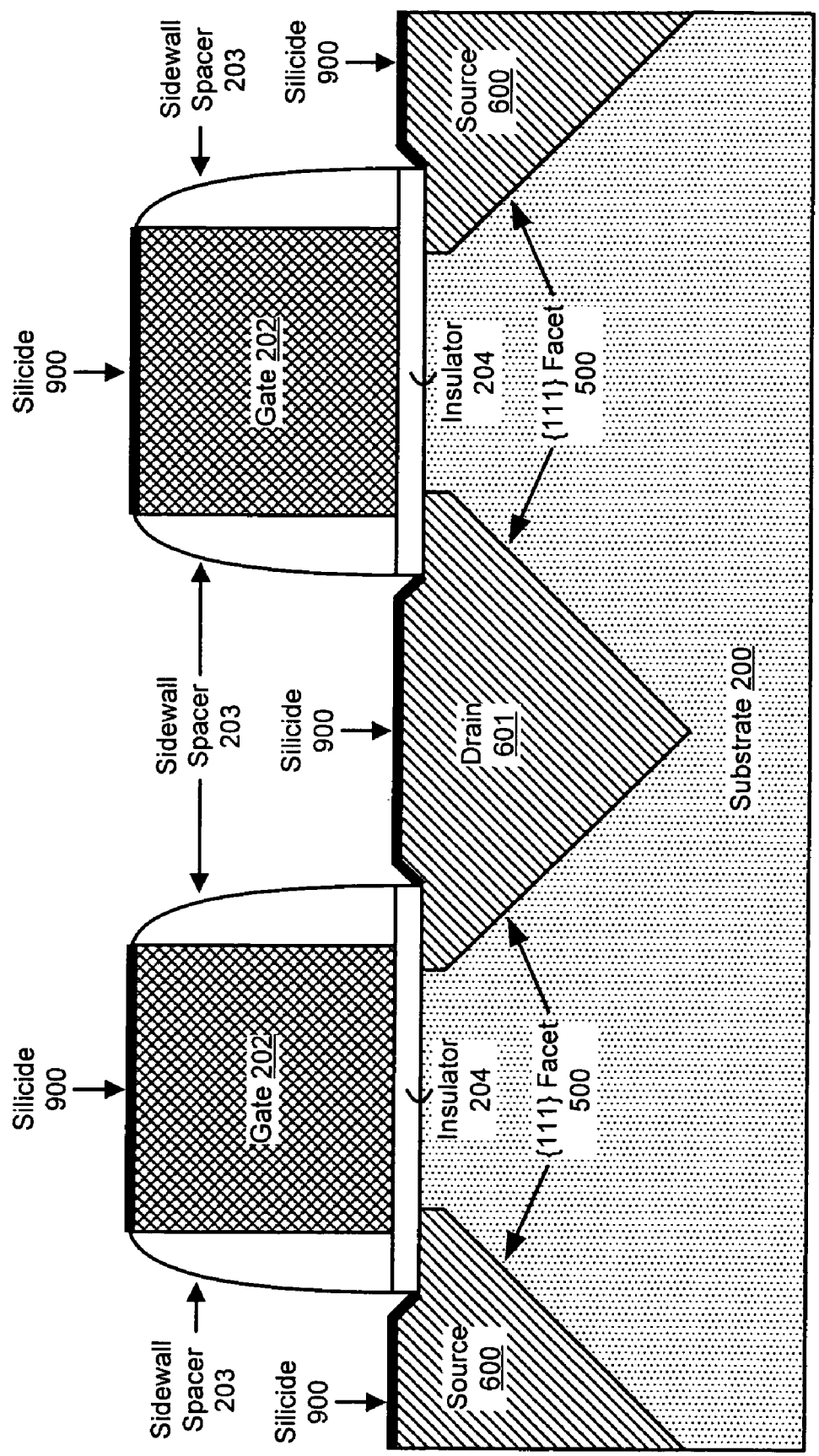
FIG. 9: illustration of the substrate cross section of FIG. 8 following the formation of a silicide

FIG. 9 illustrates the substrate 200 cross section of FIG. 8 following the formation of silicide 900 on the surfaces of gate 202, source 600, and drain 601. The silicide 900 decreases the contact resistivity between the gate 202, source 600, and drain 601 and subsequently formed plugs. In an embodiment, the silicide 900 formation includes the deposition of a refractory metal followed by an anneal. In an embodiment, the refractory metal is nickel. In alternate embodiments, the metals include cobalt and titanium. The silicide 900 of an embodiment may also be self-aligned (i.e., a salicide) as the deposited refractory metal only reacts with the exposed gate 202, source 600, and drain 601 materials to form the silicide 900 and does not react with the exposed sidewall spacers 203. Any non-reacted refractory metal can thereafter be removed. One skilled in the art will recognize subsequent processing steps to complete a transistor of an embodiment.

One skilled in the art will recognize the elegance of an embodiment as it improves the performance of a transistor by improving control of short channel effects, increasing the saturation current, improving control of the metallurgical gate length, increasing carrier mobility, and decreasing contact resistance at the interface between the source and drain and the silicide.

What is claimed is:

1. A method comprising:
   forming an insulator on a substrate;
   forming a gate on the insulator;
   forming a plurality of sidewall spacers on the lateral surfaces of the gate; and
   etching, with a wet etch, a source region and a drain region in the substrate, the wet etch substantially selective to a crystallographic plane in the substrate;
   forming, with the wet etch, a facet in the {010} crystallographic plane of the substrate in the source region and a facet in the {010} crystallographic plane of the substrate in the drain region, the {010} facets extending laterally beneath the gate into the substrate region directly under the gate.
   forming, with the wet etch, a facet in the {111} crystallographic plane of the substrate in the source region and a facet in the {111} crystallographic plane of the substrate in the drain region.

2. The method of claim 1 further comprising:
   forming a source in the source region and a drain in the drain region.

3. The method of claim 2, the source and the drain further comprising silicon germanium.

4. The method of claim 3 wherein a surface of the source and a surface of the drain are substantially flush with the surface of the substrate.

5. The method of claim 3, the substrate comprising {001} silicon.

6. The method of claim 2, the wet etch chemistry having a pH of greater than approximately 9.0.

7. The method of claim 2 wherein forming the source and drain comprises depositing silicon germanium or carbon-doped silicon in the source and drain regions.

8. The method of claim 1, a wet etch chemistry selected from the group consisting of $NH_4OH$, $NH_3OH$, TMAH, KOH, NaOH, BTMH, an amine-based etchant, and a combination thereof.

9. A method comprising:
   forming an insulator on a substrate;
   forming a gate on the insulator;
   forming a plurality of sidewall spacers on the lateral surfaces of the gate; and
   etching, with a wet etch, a source region and a drain region in the substrate, the source region and the drain region each extending laterally beneath the gate into the substrate region directly under the gate, the source region and the drain region each further including
   a facet in the {111} crystallographic plane of the substrate, and
   a facet in the {010} crystallographic plane of the substrate.

10. The method of claim 9 further comprising:
    forming a source in the source region and a drain in the drain region wherein a surface of the source and a surface of the drain are substantially flush with a surface of the substrate.

11. The method of claim 10 further comprising:
    forming a silicide on the gate, on the source, and on the drain.

12. The method of claim 10, the wet etch chemistry having a pH of greater than approximately 9.0.

13. The method of claim 10 wherein forming the source and drain comprises depositing silicon germanium or carbon-doped silicon in the source and drain regions.

14. The method of claim 9, a wet etch chemistry selected from the group consisting of $NH_4OH$, $NH_3OH$, TMAH, KOH, NaOH, BTMH, an mine-based etchant, and a combination thereof.

15. The method of claim 9 wherein the substrate is {001} silicon.

* * * * *